United States Patent [19]
Gillotti et al.

[11] Patent Number: 6,062,462
[45] Date of Patent: May 16, 2000

[54] APPARATUS AND METHOD FOR MAKING PREDETERMINED FINE WIRE BALL SIZES

[75] Inventors: Gary Steven Gillotti, Lansdale; Frederick William Kulicke, Jr., Horsham, both of Pa.

[73] Assignee: Kulicke and Soffa Investments, Inc., Wilmington, Del.

[21] Appl. No.: 08/909,569

[22] Filed: Aug. 12, 1997

[51] Int. Cl.$^7$ .................................................. B23K 9/06
[52] U.S. Cl. .................. 228/180.5; 228/102; 219/56.21; 219/56.22
[58] Field of Search ................ 228/4.5, 180.5, 228/102; 219/56.21, 56.22

[56] References Cited

U.S. PATENT DOCUMENTS

| | | | |
|---|---|---|---|
| 4,523,071 | 6/1985 | Bancroft et al. | 219/56.22 |
| 4,707,579 | 11/1987 | McKiel, Jr. | 219/56.22 |
| 5,212,361 | 5/1993 | Miyazaki et al. | 219/56.22 |
| 5,214,259 | 5/1993 | Terakado et al. | 219/56.21 |
| 5,326,015 | 7/1994 | Weaver et al. | 228/4.5 |
| 5,463,197 | 10/1995 | Miyazaki | 219/56.21 |
| 5,566,876 | 10/1996 | Nishimaki et al. | 228/102 |
| 5,763,849 | 6/1996 | Nakao | 219/56.21 |

*Primary Examiner*—Patrick Ryan
*Assistant Examiner*—Lynne Edmonds
*Attorney, Agent, or Firm*—John B. Sowell

[57] ABSTRACT

A method and apparatus for making small ball size ratio air balls for use with fine pitch bonding tools includes programming an automatic wire bonder to make a predetermined diameter ball on a fine wire. The predetermined ball size, the diameter of the wire to be used is entered as input data in the wire bonder which makes a calculation of the time required to melt the volume of a fine wire tail necessary to create a spherical ball of predetermined size. The free end of the wire tail to be melted is positioned above an aperture in an EFO electrode wand. A predetermined current is applied across the gap between the aperture in the EFO wand to generate a ball on the end of the wire tail. If the ball size deviates from the preselected ball size, the ball may be increased or decreased by an incremental percentage to effect even greater ball size accuracy. Further, the spring force in the wire loop may be adjusted and/or controlled while maintaining the preselected ball size.

20 Claims, 5 Drawing Sheets

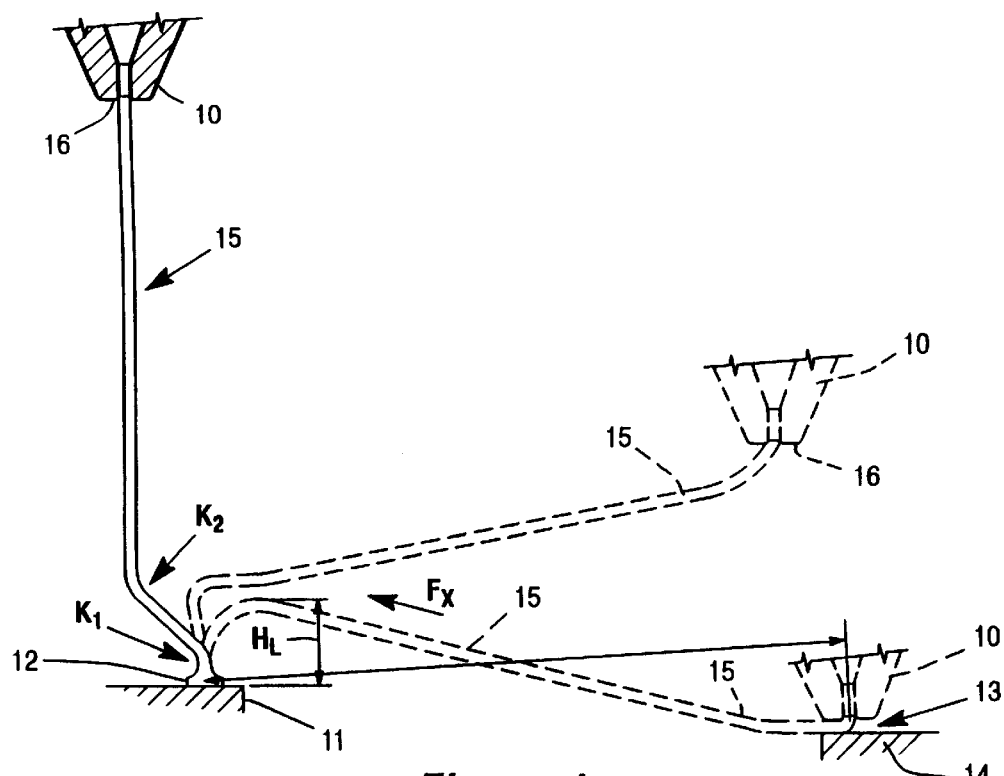
Figure 1
*Prior Art*
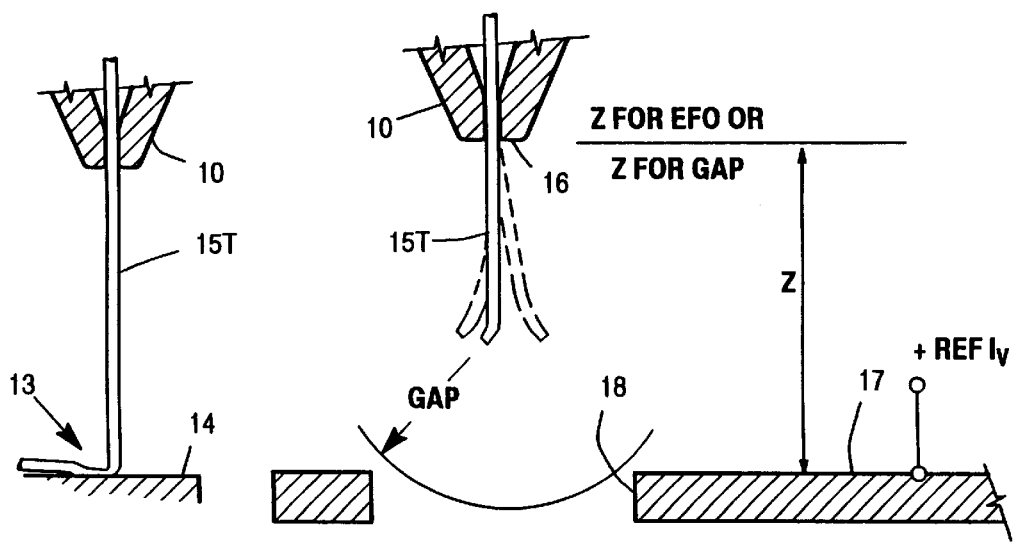
Figure 2 *Prior Art*   Figure 3

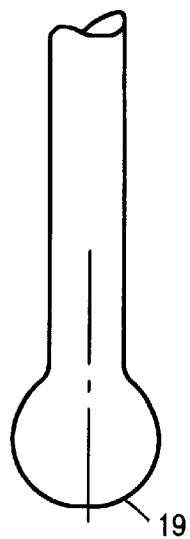
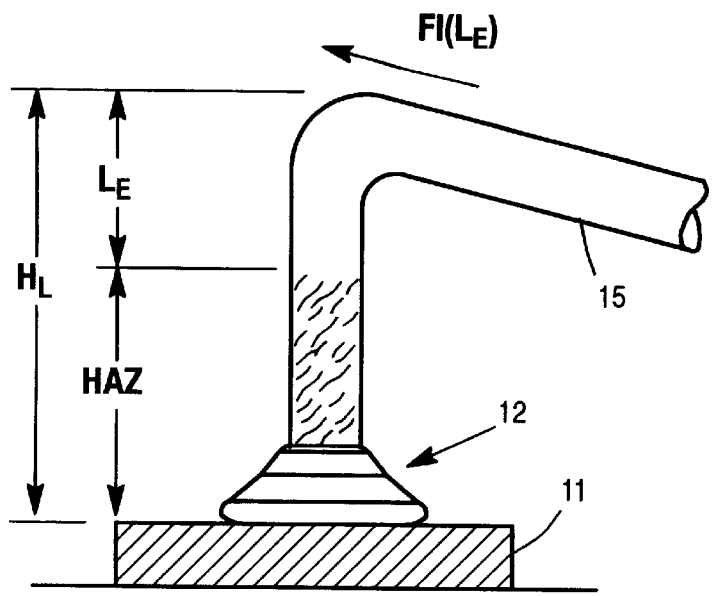
Figure 4        Figure 5
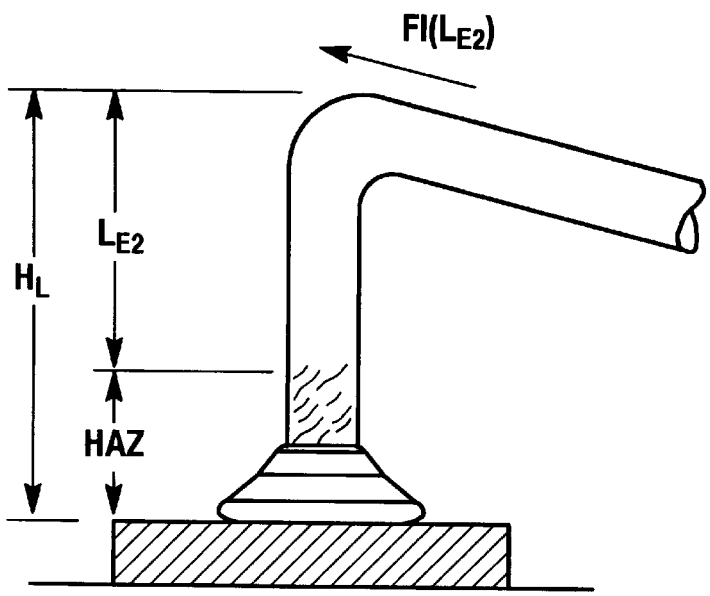
Figure 6

APPARATUS AND METHOD FOR MAKING PREDETERMINED FINE WIRE BALL SIZES

BACKGROUND OF THE INVENTION

1. Field of the Invention

The present invention relates to apparatus and a method for making balls on fine wires used in automatic ball wire bonders. More particularly, the present invention relates to a method for making an air ball of a predetermined size on any of a plurality of different types and sizes of fine bonding wires.

2. Description of the Prior Art

Automatic wire bonders require that numerous parameters be set prior to start of automatic wire bonding operations in automatic wire bonding machines. A typical example of a state of the art automatic wire bonder is a Model 1488 XQ made by Kulicke and Soffa Industries, Inc. in Willow Grove, Pa. 19090. One of the programmable displays or screens which may be selected for display on the monitor permits selection of a "Ball size ratio" and entry of the wire size in mils to be used to make the ball. It is generally assumed that the air ball size becomes the product of the wire diameter times the ball size ratio in these state of the art prior art machines. The software programmed into the wire bonder must determine the amount of wire to be melted to produce the desired ball. It can be shown that the volume of the ball is equal to $6/\Pi \times D_B^3$ where $D_B$ is the ball diameter. Also the length of the wire melted to produce the ball is equal to $4/\Pi \times D_W^2$ where $D_W$ is the diameter of the wire. In the state of the art wire bonders, a tail of wire is made which exceeds the length of wire needed to produce the ball programmed into the wire bonder. By establishing a desired or near optimum constant EFO current ($I_c$) it is possible to calculate or determine empirically the time ($T_t$) required to produce a ball for the ball size ratio programmed into the prior art wire bonders.

Programming optimum current values into an automatic wire bonder makes it relatively easy for an operator of the wire bonder to rapidly set parameters for bonding semiconductor chips that cover a broad spectrum of problems, however, such automatic selection effectively limits the operator from making needed adjustments that would be useful for improving bonding of fine wire interconnections. An example will illustrate the point. Capillary bonding tools used for fine pitch wire bonding require balls smaller than those presently recommended for standard capillary bonding tools. When a small EFO current is employed to make a small ball, the amount of spring back or elastic force in the loop was found to be reduced. It would be desirable to make small air balls for use with fine pitch capillaries such as those shown and described in U.S. Ser. No. 08/861,965 filed May 22, 1997 and U.S. Pat. No. 5,558,270, assigned to the same assignee as the present invention, and still be able to control elastic spring back in the fine wire interconnection loops.

SUMMARY OF INVENTION

It is a primary object of the present invention to provide an apparatus and a method for making small air balls on fine wire for making fine pitch ball bonds at first bond.

It is a primary object of the present invention to provide an apparatus and a method for making fine wire interconnection loops having a predetermined selectable air ball size and a predetermined elastic spring back force.

It is a general object of the present invention to provide a method and apparatus for selecting a predetermined air ball size to be made on a fine wire to be bonded at first bond and for making adjustments to compensate for uncontrollable variables.

It is a general object of the present invention to provide a method and apparatus for selecting a predetermined air ball size and EFO current for controlling spring back in fine wire loops and for making adjustments to control the spring back force selected.

It is a general object of the present invention to provide hardware and software for automatically controlling the size of air balls to be bonded and for controlling loop height and loop slack in low loop fine wire interconnections.

According to these and other objects in the present invention there is provided an input menu screen on an automatic wire bonder for entering a predetermined ball size for a known wire size to be programmed into the wire bonder. When a desired EFO current is selected for the ball size the automatic wire bonder determines or calculates a time duration for the selected current so that a known volume of fine wire is melted to produce a ball on a fine wire which has a predetermined ball size. Means are provided for increasing or decreasing the size of the ball in units or increments.

BRIEF DESCRIPTION OF THE DRAWINGS

FIG. 1 is a drawing in side elevation of a bonding tool in a bonding machine for making a prior art fine wire interconnection;

FIG. 2 is a drawing in side elevation of the bonding tool in FIG. 1 after second bond when raised to a tail height;

FIG. 3 is a drawing in side elevation of a bonding tool after being severed at second bond and raised through an aperture in the EFO electrode to a gap height;

FIG. 4 is a drawing of a ball made on a fine wire having a predetermined ball diameter size for fine pitch ball bonding;

FIG. 5 is a drawing in side elevation of a first bond of a fine wire interconnection showing a heat affected zone;

FIG. 6 is another drawing of a first wire bond similar to FIG. 5 showing a smaller heat affected zone (HAZ);

DETAILED DESCRIPTION OF THE PREFERRED EMBODIMENTS

Figure 7:
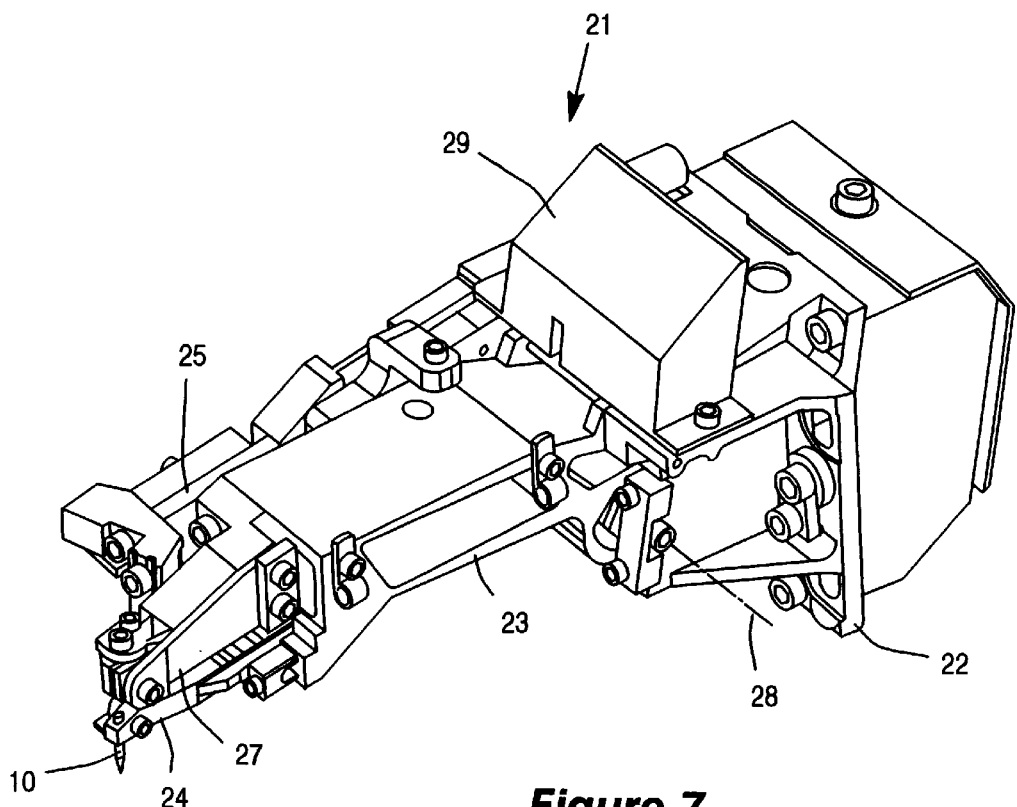
FIG. 7 is an isometric drawing of a bond head assembly which mounts on a wire bonding machine and supports a pivotable transducer length and an EFO electrode.

Refer now to FIG. 1 showing a bonding tool 10 of the type which is mounted in a transducer of an automatic wire bonding machine for making fine wire interconnections. This figure is taken from U.S. Pat. No. 4,327,860 and shows and describes a method of making a slack-free wire interconnection between a first ball bond 12 on a semiconductor pad 11 and a second wedge bond 13 on a lead frame 14. The wire 15 is payed out of the bonding tool 10 to a kink height which is above the first bond 12. The tool 10 is then moved away from the second bond horizontally to form two bends or kinks K1 and K2 in the wire. The bonding tool 10 is then moved along a predetermined path toward the second bond 13 which creates a loop at the first bond having a loop height $H_L$ that is now spring biased on the FX direction. This spring force is known to keep the interconnecting wire 15 slack-free between the bonds.

Refer now to FIG. 2 showing the bonding tool 10 raised above the second bond 13. It is known in the prior art that the wire 15 can be clamped by wire clamps (not shown) and when raised an additional amount with the bonding tool 10 will sever the wire. The wire will sever at the mashed wire bond leaving a second wedge bond 13 and a wire tail 15T.

Refer now to FIG. 3 showing the bonding tool after it has been raised to sever the wire and raised to an electronic flame-off (EFO) height. In the preferred embodiment of the present invention, the novel EFO wand 17 was previously positioned above the working face 16 of the bonding tool 10 and was fixed relative to the bonding tool head. The bonding tool 10 is centered in the aperture 18 of the wand 17 during actual bonding operations and moves vertically relative to the wand 17. After second bond, the wire 15 which forms a tail 15T is severed from the second bond 13 and raised to a predetermined flame-off height Z or to a predetermined gap height to form a predetermined gap (G) between the end of the tail 15T and the aperture 18. Applicants prefer using an automatic wire bonder which includes controls that sense the Z position of the working face 16 of the bonding tool 10 at the actual time when the wire 15 severs from second bond 13. These controls are shown and described in U.S. Pat. No. 5,591,920 which is incorporated by reference herein. Being able to determine the actual Z position of the bonding tool at the time the tail 15T severs from second bond enables the wire bonding machine to calculate the actual length of the bonding tail 15T even though it may be stretched during the severing operation. Once the tail 15T is positioned above the wand 17, a teaser voltage of several thousand volts may be applied to create an ionized path for the predetermined current I. A constant current ($I_c$) is preferably applied which passes from the aperture 18 to the end of the tail 15T for a predetermined time thus melts a predetermined amount of the tail 15T to produce a molten spherical ball containing a predetermined amount of molten metal.

Refer now to FIG. 4 showing a ball made on a fine wire 15 having a predetermined ball diameter size for fine pitch ball bonding. The ball 19 may have a ball size ratio of as low as 1.3 wherein the prior art bonding machines were programmed and set up for prior art ball size ratios of approximately 1.6 to 1.7.

Refer now to FIG. 5 showing in side elevation a ball bond made at first bond of a fine wire interconnection. The ball bond 12 is shown having a heat affected zone HAZ and a length of wire $L_E$ which represents the elastic or spring length of the wire 15. The two zones HAZ and $L_E$ comprise the loop height $H_L$. In the preferred embodiment of the present invention the operator of the automatic wire bonder is now able to control the EFO current I so as to determine the height of the heat affected zone which in turn affects the length of the elastic spring in the loop. As shown in FIG. 5 the force F1 produced by the elastic length $L_E$ provides spring tension in the loop or wire 15 away from the second bond (not shown).

Refer now to FIG. 6 which shows another drawing of a first wire bond similar to that shown in FIG. 5 which has a smaller heat affected zone HAZ and a larger elastic length $L_E$ or $L_{E2}$. The larger elastic length L produces a larger force $F_2$ as a result of the longer elastic length 2. Again the combination of HAZ and $L_{E2}$ is the loop height $H_L$. Comparing the two drawings FIG. 5 and FIG. 6, the loop height can be identical and the embodiment shown in FIG. 6 having the smaller HAZ will produce the larger spring force. Thus, the operator is now able to control the amount of current which controls the height of the HAZ which controls the spring force. In the present state of the art consistent interconnecting wire loops may be programmed having a loop height of only 5 mils plus or minus one mil and yet maintain a strong elastic force which avoids sagging or essing of the loop. In order to appreciate the present invention it should be recognized that there are numerous types of fine wires which have some amount of different alloys or adopants which also affect the HAZ. Thus, if an operator of an automatic wire bonding machine does not have experience with a particular wire he may waste an inordinate amount of time in producing a low loop. Employing the present invention he can program into the machine the desired ball size, correct the ball size to an accurate degree and then proceed to program the wire bonding machine to produce an elastic force which reduces the slack and sagging or essing in a short period of time without knowing the ingredients in the wire being bonded.

Figure 8:
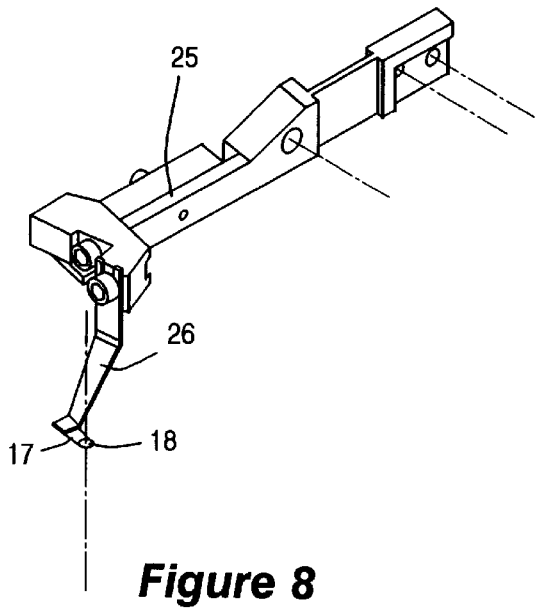
FIG. 8 is an isometric drawing of the EFO electrode and its support arm shown in FIG. 7.
Figure 9:
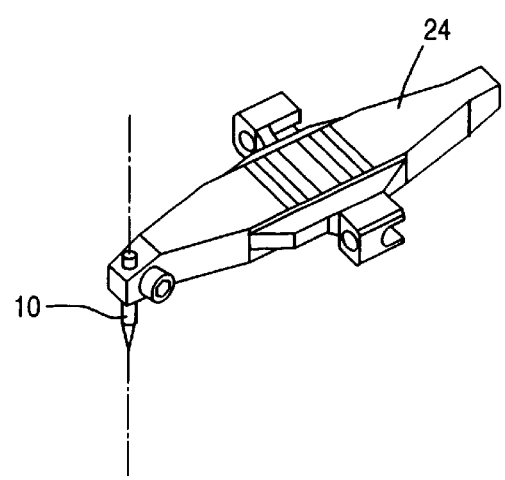
FIG. 9 is an isometric drawing of the ultrasonic transducer which is mounted on the pivotable link which mounts on the bond head assembly.

Refer to FIGS. 7 to 9. FIG. 7 is an isometric drawing of a bond head assembly 21 which mounts on an automatic wire bonding machine. The assembly 21 includes a bond head link 23 which is pivoted at pivot axis 28 on the mounting frame 22. The bond head link 23 supports an EFO assembly arm 25 which in turn supports an EFO electrode arm 26 which has attached thereto the aforementioned and described wand 17 having an aperture 18 which mounts concentrically around the bonding tool 10. Also shown above the bonding tool 10 is a wire clamp 27 which may be rapidly actuated by electronic current and employs a piezoelectric principle or may be implemented with a voice coil actuating mechanism. The bond head link 23 supports a transducer 24 which, when mounted on the bond head link 23, pivots on axis 28 to cause the bonding tool 10 to move in a substantially vertical or Z axis. The centerline of movement of the bonding tool 10 shown in FIG. 9 causes the bonding tool 10 to move concentrically and apart from the aperture 18 in the wand 17.

FIG. 8 is an isometric drawing the EFO electrode assembly arm removed from the bond head assembly 21 and FIG. 9 is an isometric drawing of the ultrasonic transducer 24 removed from the bond head length 23.

Figure 10:
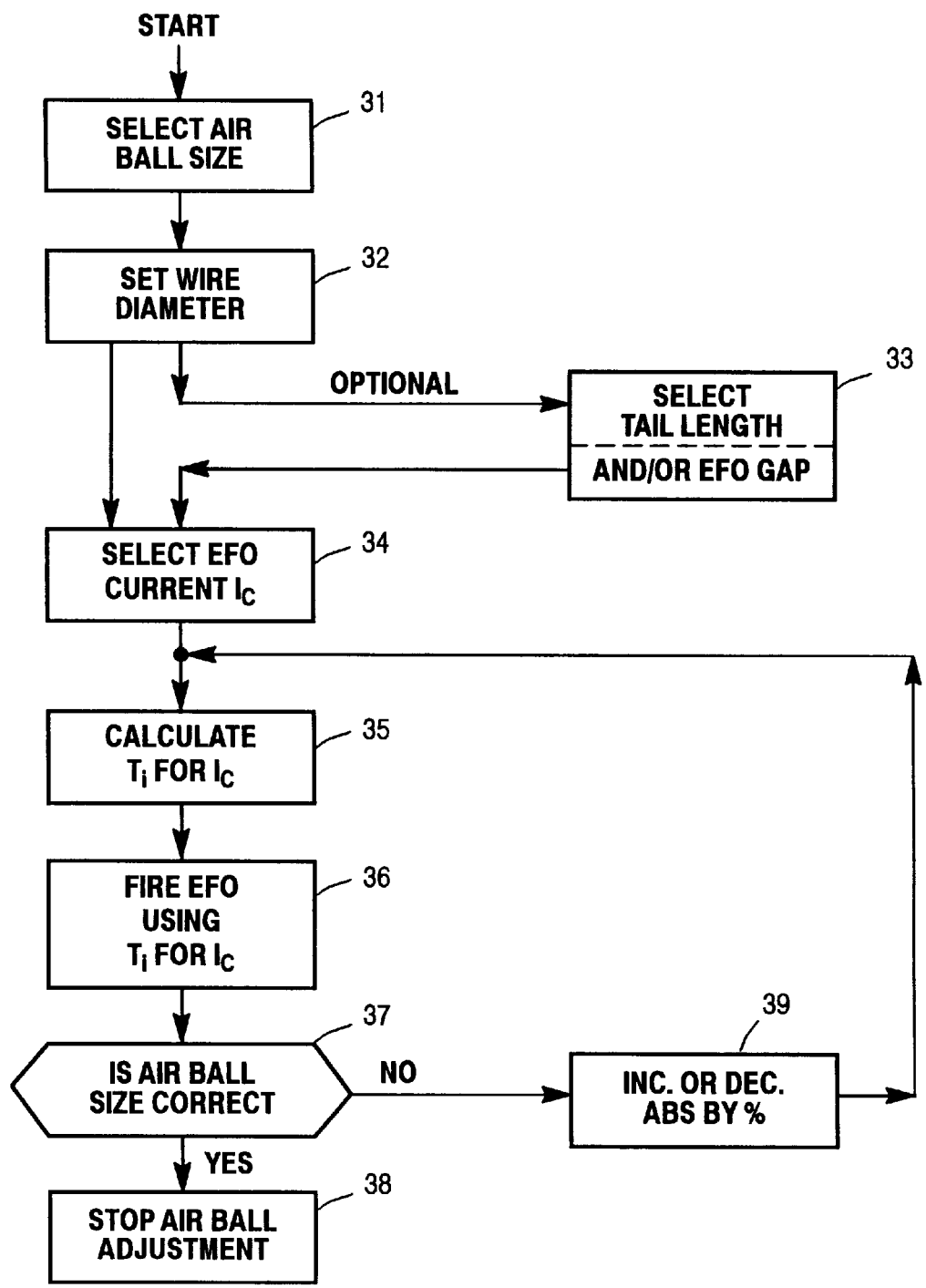
FIG. 10 is a flow diagram of the programmable procedure for making air balls of predetermined size on fine wire of different sizes.

Refer now to FIG. 10 showing a flow diagram of the programmable procedure according to the preferred embodiment of the present invention for making air balls of substantially any predetermined practical size on fine wires of different sizes and alloys. Most present day wire bonders are provided with a display or screen showing the feature which may be programmed into the automatic wire bonder. The usual way of entering such information is through a touch screen or a keyboard which serves as the user interface to the wire bonder. Once the wire bonder is powered up and prepared for the entry of data, the air ball size may be selected as shown at block 31. After entering the air ball size the operator now enters the wire diameter of the wire being used in the wire bonder as shown at block 32. After this entry, it is optional in the present embodiment of the present invention to select a wire tail length and/or to select an EFO gap as shown at block 33. In order to control and select the heat affected zone as explained hereinbefore, it is now possible for the operator to select an EFO current $I_c$ as shown at block 34. Having selected this particular current, the automatic wire bonder will maintain a constant current so that a proper calculation can be made for the amount of melted wire to be produced for the particular ball size selected. In order to produce accurately the predetermined size ball the automatic wire bonder now makes the necessary calculation of the time $T_i$ needed for producing the predetermined ball using the predetermined current as shown at block 35. The wire bonder is now effectively ready to make its first predetermined ball size. Other factors which occur are not explained in detail except that the bond operation is completed and the EFO is fired using the predetermined time and currents as at block 36. If the air ball size made is correct, it is possible to now stop the air ball adjustment as shown at blocks 37 and 38. However, if the air ball size is critical as occurs in extreme accuracy fine wire bonding it is necessary to use a high resolution camera or other optical device to determine accurately the air ball size made at block 26. This determination can be made on-line or off-line at block 37 and if the air ball is not of the correct size it is now possible to select units of increase or decrease of the air ball size by a percentage factor or units which in turn requires a new calculation for the time as shown in block 35. Again the blocks shown at 36 and 37 produce the air ball and it is again corrected until the accuracy required for automatic wire bonding is produced. Once the correct air ball size is produced the automatic wire bonder is now ready for production operations without even knowing the exact specification for the fine wire.

Figure 11:
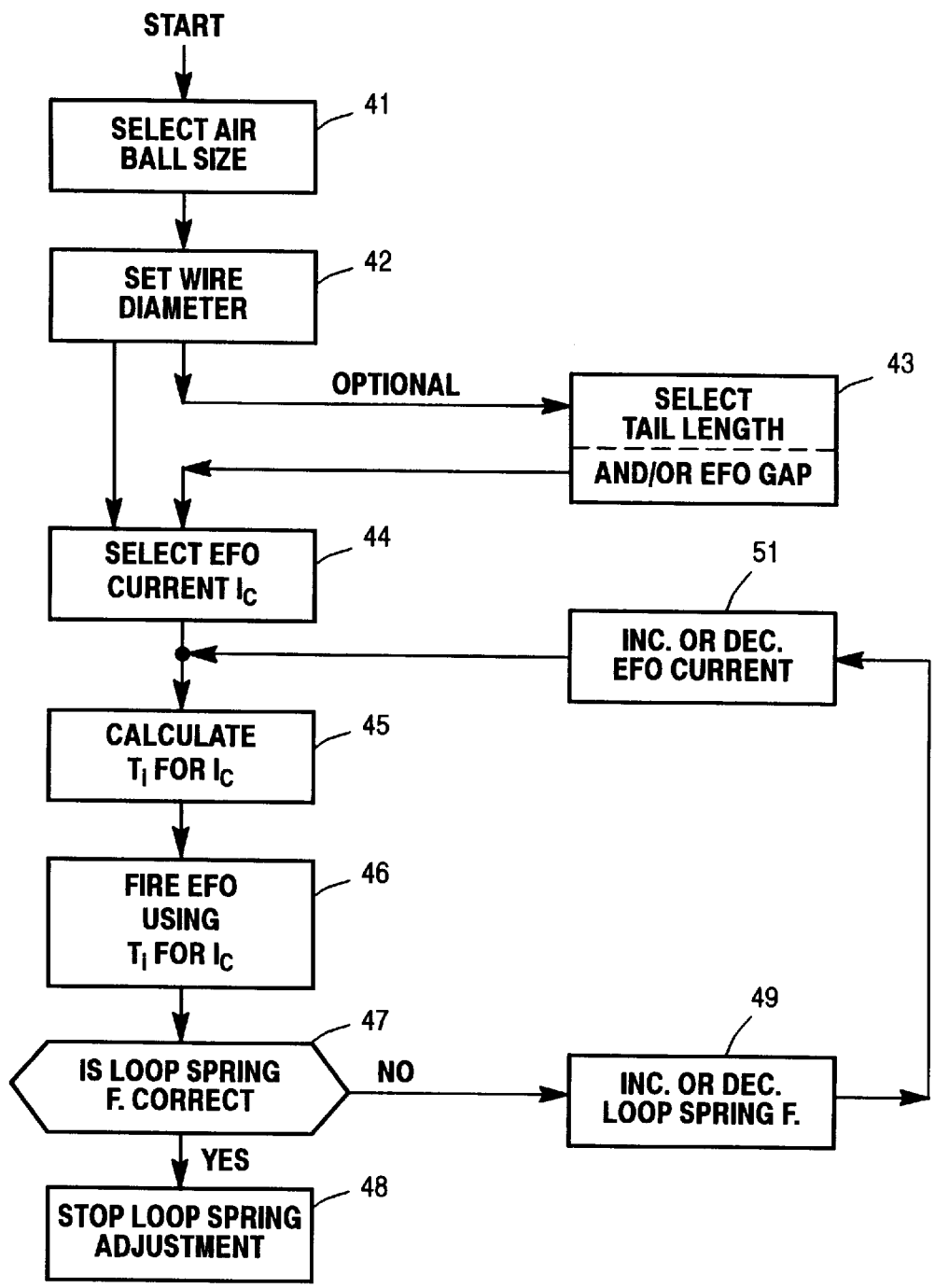
FIG. 11 is a flow diagram of another programmable procedure for making air balls of predetermined size and for controlling the loop spring force.

Refer now to FIG. 11 showing another programmable procedure for making air balls of predetermined size and for controlling the loop spring force. Before explaining the flow diagram of FIG. 11 it should be understood that the amount of spring force being produced in the loops cannot be measured by physical measuring devices. However, it is possible by observation of the amount of sag or essing in the wire loop to determine whether a sufficient amount of loop spring is present in the interconnecting wires being made. After selecting the air ball size in block 41, the wire diameter may be set as shown in block 42. Again it is optional whether to select the tail length and/or EFO gap as shown in block 43. The EFO current $I_c$ is then selected to produce a predetermined and desirable heat affected zone as shown in block 44. The desired EFO current for producing the desire heat affected zone is made in block 44 and the amount of time $T_i$ for the current selected is calculated by the automatic wire bonder as shown at block 45 for producing the predetermined ball size selected. After a fine wire is bonded, a second wire bond is made leaving a tail on which a ball can be made by firing the EFO using the selected current and calculated time as shown at block 46. It is now possible to make several such loops and determine by observation if sagging or essing is present as shown at block 47. If the spring force is sufficient to produce the desired loop there is no additional adjustments required and the adjustment of the loop spring force can be stopped as shown at block 48. However, if the observation of the loop indicates that the loop requires more or less spring force the loop spring force may be increased or decreased by incremental values as shown at block 49. After making the necessary entry for adjustment, the automatic wire bonder now must calculate an increase or decrease of the EFO current $I_c$ is shown as block 51. Having changed the selected EFO current it is now necessary to recalculate the time period for the newly selected EFO current. Admittedly, the change in EFO current at block 51 will gradually change the heat affected zone but in the preferred embodiment of the present invention it is possible to change the spring force without appreciably changing the predetermined and selected current which is directly related to the height of the heat affected zone.

Having explained a preferred embodiment of the present invention and how it is now possible to control ball sizes having extremely small ball size ratios for use with the latest fine pitch bonding tools it will be appreciated that it is also possible to control the shape and size of the loop to a degree that was not possible heretofore.

Having explained FIGS. 10 and 11, it should be apparent that once the air ball size and wire diameter are chosen, it is now possible to set an EFO gap, a wire tail length, an EFO current and to also select a time $T_i$ by direct and indirect programming.

We claim:

1. A method for making a free air ball on a fine wire in a bonding tool of a fine wire bonder, comprising the steps of:
   a. selecting a predetermined air ball size for entry in the automatic wire bonder,
   b. selecting the wire diameter size of the fine wire used in the wire bonder,
   c. selecting a desired electronic flame off (EFO) current $I_c$ to be used to melt the fine wire and make said air ball,
   d. automatically calculating a time duration $T_i$ for application of said selected EFO current,
   e. positioning a free end of a fine wire tail juxtaposed an EFO electrode at a known gap, and
   f. applying said EFO current between said EFO electrode and said fine wire tail for the calculated time $T_i$,
   g. whereby a predetermined volume of said wire tail is melted and forms a spherical ball having the predetermined selected air ball size.

2. The method for making a free air ball on a fine wire as set forth in claim 1 which further includes selecting a desired gap (G) between said EFO electrode and the free end of the wire tail.

3. The method for making a free air ball as set forth in claim 2 which further includes sensing the vertical (Z) position of said bonding tool at the time said free end of said fine wire tail breaks after making a second bond of a fine wire interconnection,
   calculating the length of the wire tail that extends from said bonding tool,
   calculating a vertical flame-off height ($Z_{FO}$) to produce said desired gap between said electrode and said free end of said fine wire tail,
   raising said fine wire tail in said bonding tool to a height ($Z_{FO}$) necessary to generate said desired gap, and
   forming said desired gap (G) under the depending end of said fine wire tail.

4. The method for making a free air ball as set forth in claim 3 wherein the step of forming said desired gap (G) comprises raising said fine wire tail through a substantially circular opening in said EFO electrode.

5. The method for making a free air ball as set forth in claim 3 wherein the step of forming said desired EFO gap comprises fixing the position of said EFO electrode in space axially below the free end of said fine wire.

6. The method for making a free air ball as set forth in claim 1 wherein the step of positioning a free end of a fine wire tail juxtaposed an EFO electrode comprises:
   fixing the EFO electrode relative to the fine wire bonder in space,
   providing a substantially circular aperture in said EFO electrode, positioning the bonding tool through said aperture for making wire bonds, and retracting said bonding tool vertically and above said fixed EFO electrode for making said fine wire tail.

7. The method for making a free air ball as set forth in claim 6 which further includes the steps of:

extending said bonding tool into the circular aperture in the EFO electrode, centering the EFO electrode on the bonding tool, and fixing the position of the EFO electrode on the bonding machine concentrically surrounding said bonding tool.

8. Apparatus for making free air balls on the end of a fine wire extending from a bonding tool in a wire bonding machine, comprising:

A) programmable control means in said bonding machine for directing said bonding machine to make a ball bond at a first wire bond position and a wedge bond at a second wire bond position, B) said control means further comprising:
  a) means for selecting a desired air ball size,
  b) means for setting the diameter of said fine wire to be bonded,
  c) means for selecting a desired constant EFO current to be used to make said air ball,
  d) means for calculating a fixed time duration for application of the selected EFO current, and
  e) means for applying the selected EFO current for the calculated time duration across the gap between an EFO electrode and the free end of a fine wire tail made after a second wire bond.

9. Apparatus as set forth in claim 7 wherein said EFO electrode comprises a fixed position wand which substantially surrounds the bonding tool during a bonding operation.

10. Apparatus as set forth in claim 7 wherein said EFO electrode comprises a fixed position wand having a substantially circular aperture therein which is fixed at a position below the free end of said fine wire tail during a flame-off operation.

11. Apparatus as set forth in claim 9 wherein said circular aperture is made only slightly larger than the diameter of the bonding tool and forms a means for positioning and fixing said EFO electrode concentric and relative to said bonding tool.

12. A method of making highly accurate free air balls on a fine wire tail made after a second bond of a fine wire interconnection made by a bonding tool in an automatic wire bonder, comprising:

programming a selected air ball size and a wire diameter size into the wire bonder, programming EFO time or current units for making said ball into said wire bonder, calculating the current or time units knowing one of the other specified units, making a wire tail after a second bond, providing an EFO wand fixed in space with an aperture which substantially surrounds said bonding tool, raising said bonding tool vertically from said aperture in said EFO wand to position the free end of said fine wire tail at a predetermined gap distance above said aperture, and applying said EFO current for said time to produce an air ball on said fine wire tail having the programmed preselected size.

13. A method for making free air balls on a fine wire in a bonding tool of a fine wire bonder, comprising the steps of:

a. selecting a predetermined air ball size, b. setting the wire diameter size of the fine wire in the wire bonder, c. selecting a desired electronic flame off (EFO) current $I_c$ to be used to melt the fine wire and make said air ball.

d. calculating a time duration $T_i$, for application of said selected EFO current, e. positioning a free end of a fine wire tail juxtaposed an EFO electrode, f. applying said EFO current between said EFO electrode and said fine wire tail for the time $T_i$, for melting a predetermined volume of said wire tail end for forming a spherical ball having the selected ball diameter size, g. determining the actual size and shape of the formed ball, and h. selecting units of adjustment which modify ball size to equal or maintain the selected ball size.

14. The method as set forth in claim 13 which further includes repeating the steps (d) to (f) for making spherical balls equal to the selected ball size.

15. The method as set forth in claim 14 which further includes determining the actual ball size on-line during bonding operations.

16. The method as set forth in claim 15 which further includes observing the actual size of the ball before bonding.

17. The method as set forth in claim 15 which further includes observing the actual size of the ball after bonding and determining the units of adjustment desired to select a new air ball size.

18. The method as set forth in claim 13 which further includes selecting units of adjustment to modify the loop height.

19. The method as set forth in claim 18 which further includes adjusting the current to modify the heat affected zone and the spring back of a wire loop.

20. The method as set forth in claim 19 which further includes modifying the spring back while maintaining the ball size.

* * * * *